(12) United States Patent
Saito et al.

(10) Patent No.: US 10,057,529 B2
(45) Date of Patent: Aug. 21, 2018

(54) PHOTOELECTRIC CONVERSION DEVICE

(71) Applicant: CANON KABUSHIKI KAISHA, Tokyo (JP)

(72) Inventors: Kazuhiro Saito, Tokyo (JP); Takanori Yamashita, Hachioji (JP); Tatsuya Ryoki, Kawasaki (JP); Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/630,013

(22) Filed: Jun. 22, 2017

(65) Prior Publication Data
US 2018/0007297 A1 Jan. 4, 2018

(30) Foreign Application Priority Data
Jun. 30, 2016 (JP) .................. 2016-131040

(51) Int. Cl.
| H04N 3/14 | (2006.01) |
| H04N 5/335 | (2011.01) |
| H04N 5/378 | (2011.01) |
| H03M 1/12 | (2006.01) |
| H01L 27/146 | (2006.01) |

(52) U.S. Cl.
CPC ....... *H04N 5/378* (2013.01); *H01L 27/14634* (2013.01); *H01L 27/14636* (2013.01); *H03M 1/12* (2013.01)

(58) Field of Classification Search
CPC .... H04N 5/378; H04N 5/37455; H04N 5/374; H01L 2224/13; H01L 2224/13025
See application file for complete search history.

(56) References Cited

U.S. PATENT DOCUMENTS

| 7,903,056 B2 | 3/2011 | Kawasaki et al. |
| 7,907,196 B2 | 3/2011 | Ogura et al. |
| 8,120,681 B2 * | 2/2012 | Ryoki .................. H04N 5/3575 348/245 |

(Continued)

FOREIGN PATENT DOCUMENTS

| JP | 2011-119946 A | 6/2011 |
| JP | 2012-015277 A | 1/2012 |

OTHER PUBLICATIONS

U.S. Appl. No. 15/620,972, filed Jun. 13, 2017 (First Named Inventor: Takanori Yamashita).

*Primary Examiner* — Chia-Wei A Chen
(74) *Attorney, Agent, or Firm* — Fitzpatrick, Cella, Harper & Scinto

(57) ABSTRACT

A device has stacked first and second substrates. The first substrate includes pixel array having pixels arranged along surface, the second substrate includes readout circuit having first AD-conversion circuit for generating first digital signals corresponding to first signals from the pixels, first parallel-serial conversion circuit for outputting first serial signal by performing parallel-serial conversion on the first digital signals, and processing circuit for processing the first serial signal. In orthogonal projection to the surface, part of the pixel array and part of the processing circuit overlap with each other. The first AD-conversion circuit is arranged between edge of the second substrate and the processing circuit. The first parallel-serial conversion circuit is arranged between the first AD-conversion circuit and the processing circuit.

20 Claims, 8 Drawing Sheets

(56) References Cited

U.S. PATENT DOCUMENTS

| | | | |
|---|---|---|---|
| 8,169,525 B2 | 5/2012 | Ryoki et al. | |
| 8,553,118 B2 | 10/2013 | Saito et al. | |
| 8,711,259 B2 | 4/2014 | Maehashi et al. | |
| 8,872,092 B2 | 10/2014 | Ryoki et al. | |
| 9,083,906 B2 | 7/2015 | Nakamura et al. | |
| 9,252,169 B2* | 2/2016 | Kobayashi | H01L 27/14636 |
| 9,338,377 B2 | 5/2016 | Itano et al. | |
| 9,502,451 B2 | 11/2016 | Yamashita et al. | |
| 9,608,025 B2* | 3/2017 | Ryoki | H01L 27/14643 |
| 9,897,482 B2* | 2/2018 | Shimotsusa | G01J 1/44 |
| 2010/0159628 A1* | 6/2010 | Kim | H01L 27/1463 438/64 |
| 2010/0271526 A1* | 10/2010 | Okuzaki | H04N 5/3458 348/311 |
| 2011/0233702 A1* | 9/2011 | Takahashi | H01L 21/76898 257/432 |
| 2012/0120293 A1* | 5/2012 | Mabuchi | H01L 27/14632 348/302 |
| 2012/0175498 A1* | 7/2012 | Krymski | H01L 27/14609 250/208.1 |
| 2013/0089175 A1* | 4/2013 | Mo | H04N 5/355 377/49 |
| 2013/0105667 A1* | 5/2013 | Kobayashi | H01L 27/14634 250/208.1 |
| 2013/0221197 A1* | 8/2013 | Shimotsusa | G01J 1/44 250/208.1 |
| 2015/0156432 A1* | 6/2015 | Tozawa | H04N 5/3698 348/302 |
| 2015/0163440 A1* | 6/2015 | Furumochi | H04N 9/735 348/223.1 |
| 2015/0270314 A1* | 9/2015 | Miyazaki | H01L 27/307 257/40 |
| 2016/0006967 A1 | 1/2016 | Yamashita et al. | |
| 2016/0381315 A1* | 12/2016 | Hagihara | H04N 5/378 348/300 |
| 2017/0064225 A1 | 3/2017 | Yamazaki | |
| 2017/0078603 A1 | 3/2017 | Yamasaki et al. | |
| 2017/0094139 A1* | 3/2017 | Blanquart | H04N 5/2256 |
| 2017/0104948 A1* | 4/2017 | Shem | H04N 5/378 |
| 2017/0221955 A1* | 8/2017 | Kudoh | H01L 27/14636 |
| 2017/0230598 A1* | 8/2017 | Takayanagi | H04N 5/378 |
| 2017/0295334 A1* | 10/2017 | Chuang | H04N 5/378 |
| 2017/0301717 A1* | 10/2017 | Kudoh | H01L 27/14643 |
| 2017/0366776 A1* | 12/2017 | Ise | H04N 5/2253 |
| 2018/0000333 A1* | 1/2018 | Blanquart | H01L 27/1464 |
| 2018/0012924 A1* | 1/2018 | Umebayashi | H01L 27/14632 |
| 2018/0054583 A1* | 2/2018 | Iwabuchi | H04N 5/2253 |
| 2018/0077398 A1* | 3/2018 | Furumochi | H04N 5/23293 |
| 2018/0084212 A1* | 3/2018 | Wakabayashi | H01L 27/14636 |

\* cited by examiner

PHOTOELECTRIC CONVERSION DEVICE

BACKGROUND OF THE INVENTION

Field of the Invention

The present invention relates to a photoelectric conversion device.

Description of the Related Art

In recent years, a solid-state imaging device formed by bonding two substrates has been provided. In such a solid-state imaging device, some of a plurality of elements forming pixels can be arranged on one substrate and the remaining plurality of elements can be arranged on the other substrate. This kind of an arrangement is advantageous in increasing the number of pixels or increasing the size of a photoelectric conversion unit.

However, an arrangement as that described above requires some of the plurality of elements forming the pixels and the remaining plurality of elements to be connected between the two substrates. Hence, this can require a high process technique and generate characteristic variation among the pixels.

SUMMARY OF THE INVENTION

The present invention provides a technique advantageous in suppressing characteristic variation among pixels in addition to facilitating the manufacture of a photoelectric conversion device by simplifying the structure of the photoelectric conversion device formed by stacking substrates.

One of the aspects of the present invention provides a photoelectric conversion device comprising a first substrate and a second substrate which are stacked, wherein the first substrate includes a pixel array in which a plurality of pixels are arranged along a surface, the second substrate includes a readout circuit configured to read out a signal from the pixel array, the readout circuit includes a first AD conversion circuit configured to generate a plurality of first digital signals by performing analog-to-digital conversion on a plurality of first signals output from the pixel array to a plurality of first signal lines, a first parallel-serial conversion circuit configured to output a first serial signal by performing parallel-serial conversion on the plurality of first digital signals, and a processing circuit configured to process the first serial signal, in an orthogonal projection to the surface, at least a part of the pixel array and at least a part of the processing circuit overlap with each other, the first AD conversion circuit is arranged between a first edge of the second substrate and the processing circuit, and the first parallel-serial conversion circuit is arranged between the first AD conversion circuit and the processing circuit.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Although the present invention is applied preferably to a solid-state imaging device, it is also applicable to a photoelectric conversion device for purposes other than imaging. For example, the present invention may be used for distance measurement, light amount measurement, or the like. A description of some embodiments will be given using an example of the solid-state imaging device hereinafter.

Figure 1:
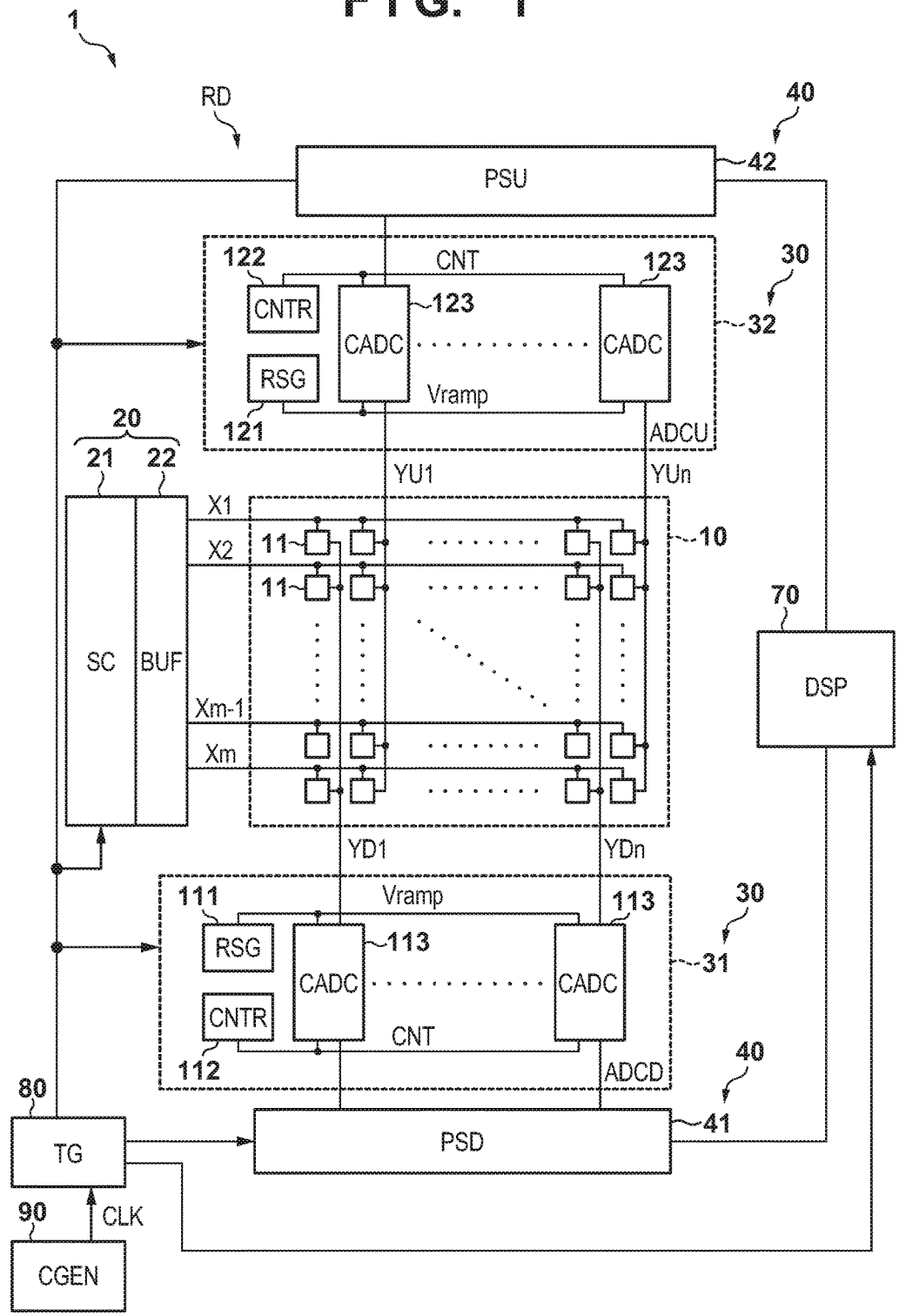
FIG. 1 is a block diagram showing the circuit arrangement of a solid-state imaging device according to one embodiment of the present invention.

FIG. 1 shows the circuit arrangement of a solid-state imaging device 1 according to one embodiment of the present invention. The solid-state imaging device 1 includes a pixel array 10 and a readout circuit RD that reads out signals from the pixel array 10. The pixel array 10 includes a plurality of pixels 11 arranged along a predetermined surface. The plurality of pixels 11 are arranged so as to form a plurality of rows and a plurality of columns. The pixel array 10 can include the plurality of pixels 11 forming a first group (for example, odd-numbered columns) and the plurality of pixels 11 forming a second group (for example, even-numbered columns). Each of the plurality of pixels 11 includes a photoelectric conversion element. Hence, the pixel array 10 can include a plurality of photoelectric conversion elements forming the first group and a plurality of photoelectric conversion elements forming the second group.

The readout circuit RD can include, for example, AD conversion circuits 30, parallel-serial conversion circuits 40, a vertical scanning circuit 20, a processing circuit 70, a timing generation circuit 80, and a clock generation circuit 90.

The AD conversion circuits 30 generate a plurality of digital signals by performing analog-to-digital conversion on the plurality of signals output from the pixel array 10 to a plurality of signal lines YDi and YUi (i=1 to n), respectively. The AD conversion circuits 30 can include a first AD conversion circuit 31 and a second AD conversion circuit 32. The first AD conversion circuit 31 generates a plurality of first digital signals by performing analog-to-digital conversion on a plurality of first signals output from the plurality of pixels 11 forming the first group of the pixel array 10 to the plurality of first signal lines YDi, respectively. The second AD conversion circuit 32 generates a plurality of second digital signals by performing analog-to-digital conversion on a plurality of second signals output from the plurality of pixels 11 forming the second group of the pixel array 10 to the plurality of second signal lines YUi, respectively.

The first AD conversion circuit 31 can include, for example, a plurality of first column AD converters 113 corresponding to the respective plurality of first signal lines YDi, a first signal generator 111, and a counter 112. The first signal generator 111 generates a reference signal Vramp whose voltage changes linearly with respect to the elapsed time such as a ramp signal or the like. The counter 112 performs a count operation and outputs a count value CNT corresponding to the elapsed time. Each first column AD converter 113 compares the first signal with the reference signal Vramp and generates, as a first digital signal, a signal corresponding to a timing in which the comparison result is inverted.

The second AD conversion circuit 32 can have the same arrangement as that of the first AD conversion circuit 31. That is, the second AD conversion circuit 32 can include, for example, a plurality of second column AD converters 123 corresponding to the respective plurality of second signal lines YUi, a second signal generator 121, and a counter 122. The second signal generator 121 generates a reference signal Vramp whose voltage changes linearly with respect to the elapsed time such as a ramp signal or the like. The counter 122 performs a count operation and outputs a count value CNT corresponding to the elapsed time. Each second column AD converter 123 compares the second signal with the reference signal Vramp and generates, as a second digital signal, a signal corresponding to a timing in which the comparison result is inverted.

The parallel-serial conversion circuits 40 can include a first parallel-serial conversion circuit 41 and a second parallel-serial conversion circuit 42. The first parallel-serial conversion circuit 41 outputs a first serial signal by performing parallel-serial conversion on the plurality of first digital signals output from the first AD conversion circuit 31. The second parallel-serial conversion circuit 42 outputs a second serial signal by performing parallel-serial conversion on the plurality of second digital signals from the second AD conversion circuit 32. Each of the first parallel-serial conversion circuit 41 and the second parallel-serial conversion circuit 42 can include a horizontal scanning circuit. The parallel-serial conversion circuits 40 serially output the plurality of the digital signals which have been input to the parallel-serial conversion circuit 40 via parallel paths. A stream of the digital signals which are output from the parallel-serial conversion circuit 40 forms a serial signal. Each serialized signal includes a multi-bit signal. For example, if each AD conversion circuit has a 12-bit resolution, each serialized digital signal includes a 12-bit digital signal.

The vertical scanning circuit 20 scans the plurality of rows of the pixel array 10. More specifically, the vertical scanning circuit 20 selects (activates), in a predetermined order, each of a plurality of row control signals Xj (j=1 to m) corresponding to each of the plurality of rows of the pixel array 10. The vertical scanning circuit 20 can include, for example, a scanning circuit SC formed by a shift register or the like and a buffer 22 that generates the plurality of row control signals Xj by buffering the signals output from the scanning circuit SC.

The processing circuit 70 is formed from a digital signal processor and processes (for example, performs noise reduction, color processing, correction, or compression) the serial signals supplied from the parallel-serial conversion circuits 40 (41, 42). Each serialized signal is, for example, a 12-bit digital signal. The timing generation circuit 80 generates a control signal to control the vertical scanning circuit 20, the AD conversion circuits 30, the parallel-serial conversion circuits 40, and the processing circuit 70 based on a clock signal CLK supplied from the clock generation circuit 90. The clock generation circuit 90 includes, for example, a DLL (Delay-Locked Loop), generates the clock signal CLK that is synchronized with a clock signal supplied from the outside, and supplies the generated clock signal to the timing generation circuit 80. Alternatively, a reference clock may be supplied from the outside, and the timing generation circuit 80 and the processing circuit 70 may directly receive this reference clock. In such a case, the clock output from the timing generation circuit 80 can be multiplied by the clock generation circuit 90 to generate a clock having a higher frequency, and the clock output from the clock generation circuit 90 can be supplied to the counter 112.

Figure 2:
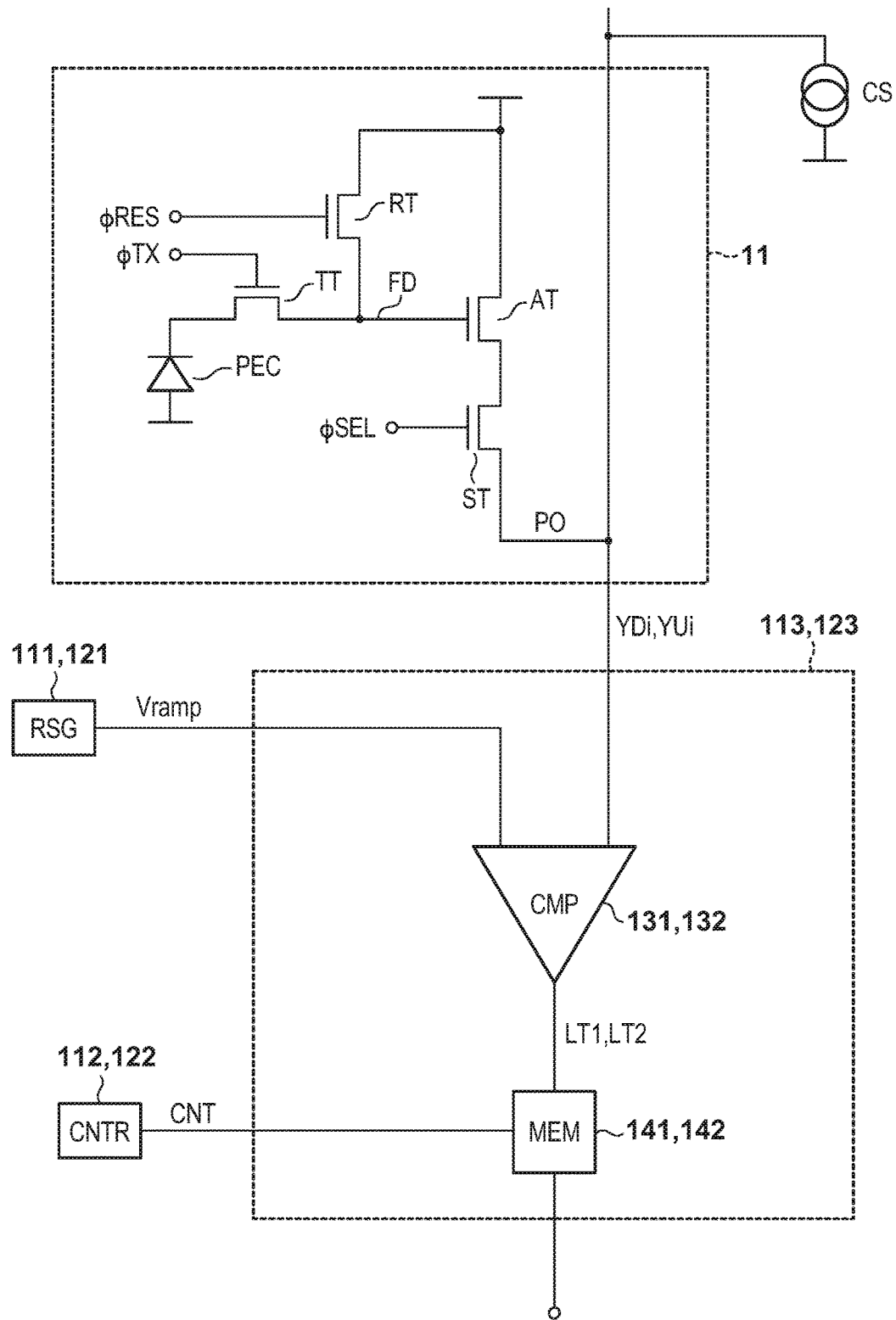
FIG. 2 is a diagram showing an example of the arrangement of one pixel of a pixel array and a first AD converter or a second AD converter shown in FIG. 1.

FIG. 2 shows an example of the arrangement of one pixel 11 of the pixel array 10 and the first column AD converter 113 or the second column AD converter 123 shown in FIG. 1. The pixel 11 includes a photoelectric conversion element PEC and outputs, from an output terminal PO to the signal line YDi or YUi, a signal corresponding to a signal generated by photoelectric conversion in the photoelectric conversion element PEC.

The pixel 11 can include the photoelectric conversion element PEC, a floating diffusion FD, and a transfer transistor TT that transfers the charges accumulated in the photoelectric conversion element PEC to the floating diffusion FD. The transfer transistor TT is turned on in response to the activation of a transfer signal φTX, which is controlled by the vertical scanning circuit 20, and transfers the charges accumulated in the photoelectric conversion element PEC to the floating diffusion FD. A voltage corresponding to the charges transferred from the photoelectric conversion element PEC appears in the floating diffusion FD. The pixel 11 can include an amplification transistor AT that outputs a signal corresponding to the voltage of the floating diffusion FD to the signal line YDi or YUi. The amplification transistor AT forms a source-follower circuit together with each current source CS connected to the signal lines YDi or YUi.

The pixel 11 can include a reset transistor RT that resets the voltage of the floating diffusion FD. The reset transistor RT is turned on in response to the activation of a reset signal φRES, which is controlled by the vertical scanning circuit 20, and resets the voltage of the floating diffusion FD. The pixel 11 can also include a selection transistor ST. The selection transistor ST is turned on in response to the activation of a selection signal φSEL, which is controlled by the vertical scanning circuit 20, and outputs the signal output from the amplification transistor AT to the signal line YDi or YUi. The control signals φTX, φRES, and φSEL have been described representatively as the control signals Xj in the above description.

In the above-described example, a single amplification transistor AT has been provided for each photoelectric conversion element PEC. However, a single amplification transistor AT may be provided for a plurality of photoelectric conversion elements PEC. In this case, the reset transistor RT and the selection transistor ST can also be shared by the plurality of photoelectric conversion elements PEC. Also, although the selection transistor ST has been provided in the above-described example, an arrangement in which a pixel is selected by adjusting the reset voltage of the floating diffusion FD may be adopted instead of providing the selection transistor ST.

Each first column AD converter 113 includes a first comparator 131 that compares the reference signal Vramp with the first signal output from the pixel array 10 to the corresponding first signal line of the plurality of first signal lines YDi. The first column AD converter 113 generates, as the first digital signal, a signal corresponding to the timing in which the comparison result by the first comparator 131 is inverted. The first column AD converter 113 can include a first memory 141 that holds the first digital signal. Here, the first comparator 131 activates a latch signal LT1 at a timing in which the comparison result between the first signal and the reference signal Vramp is inverted. The first memory 141 obtains the count value CNT supplied from the counter 112 at a timing in which the latch signal LT1 is activated.

In the same manner, each second column AD converter 123 includes a second comparator 132 that compares the reference signal Vramp with a second signal output from the pixel array 10 to the corresponding second signal line of the plurality of the second signal lines YUi. The second column AD converter 123 generates, as the second digital signal, a signal corresponding to the timing in which the comparison result by the second comparator 132 is inverted. The second column AD converter 123 can include a second memory 142 that holds the second digital signal. Here, the second comparator 132 activates a latch signal LT2 at a timing in which the comparison result between the second signal and the reference signal Vramp is inverted. The second memory 142 obtains the count value CNT supplied from the counter 122 at a timing in which the latch signal LT2 is activated.

Although it is not shown for the sake of descriptive convenience, note that each of the column AD converters 113 and 123 may be formed so as to hold a reset level and an optical signal level output from the pixel array 10 to the corresponding one of the signal lines YDi and YUi. In this case, the first digital signal includes a reset level digital signal and an optical signal level digital signal. The processing circuit 70 can be formed so as to calculate (CDS) the difference between the optical signal level and the reset level. Alternatively, each of the column AD converters 113 and 123 may be formed so as to output a digital signal corresponding to the difference between the optical signal level and the reset signal level. The reset level is the level output to the signal line YDi or YUi in a state in which the voltage of the floating diffusion FD has been reset or immediately after the reset operation has been canceled by the reset transistor RT. The optical signal level is the level output to the signal line YDi or YUi in a state in which the charges generated by incident light in the photoelectric conversion element PEC have been transferred by the transfer transistor TT to the floating diffusion FD.

Figure 3A:
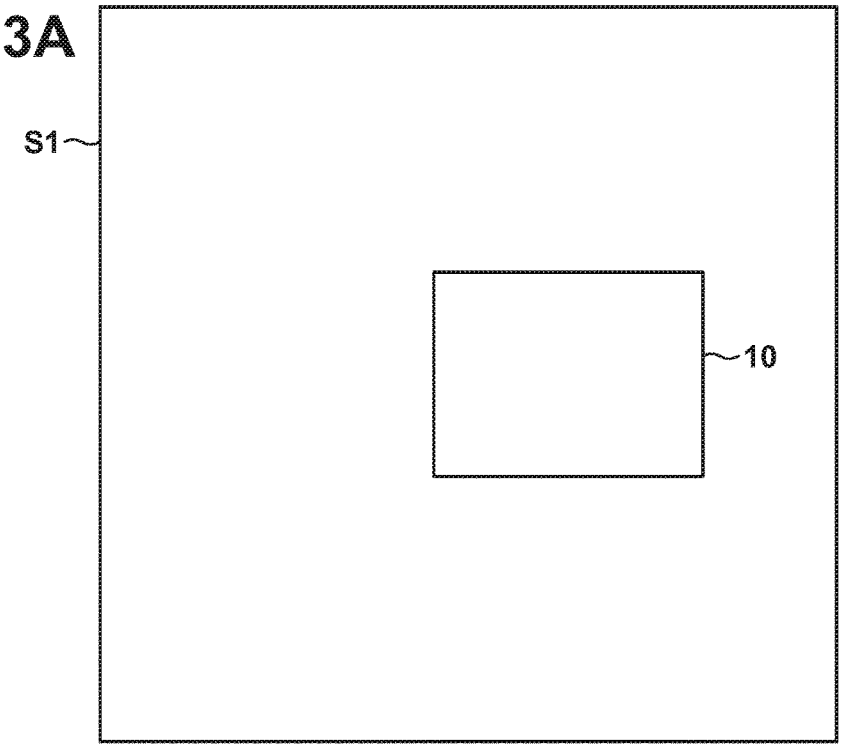
FIG. 3A is a view showing an example of the layout arrangement of a first substrate of the first substrate and a second substrate that form the solid-state imaging device according to one embodiment of the present invention.
Figure 3B:
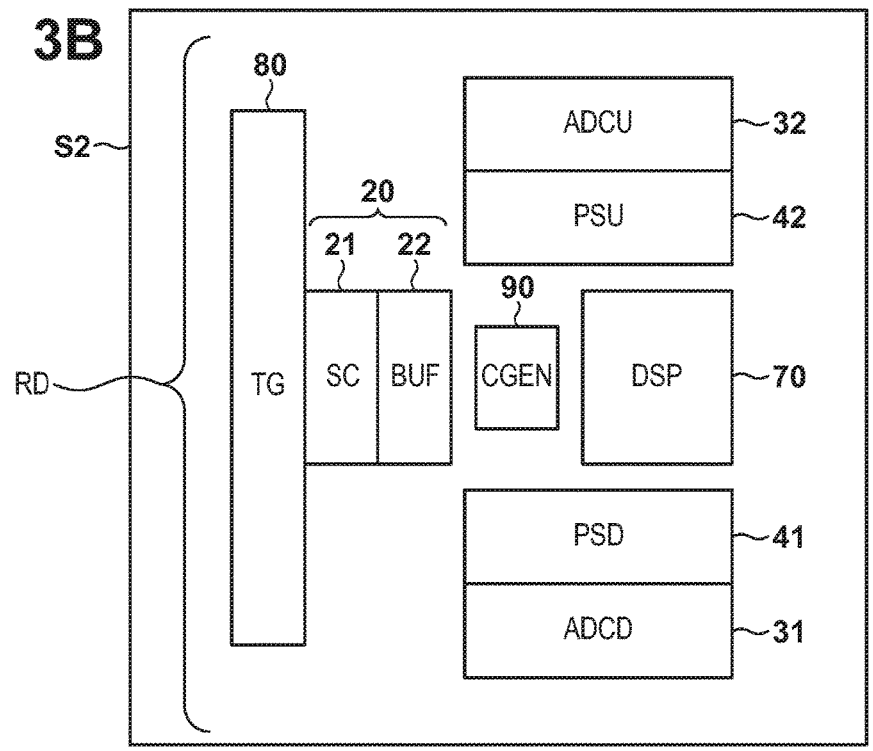
FIG. 3B is a view showing an example of the layout arrangement of the second substrate of the first substrate and the second substrate that form the solid-state imaging device according to one embodiment of the present invention.

The solid-state imaging device 1 is formed by stacking a first substrate S1 exemplified in FIG. 3A and a second substrate S2 exemplified in FIG. 3B. The first substrate S1 includes the pixel array 10 on which the plurality of pixels 11 are arranged along a predetermined surface. The predetermined surface can be one of the two surfaces of the first substrate S1. The predetermined surface can be understood as the surface corresponding to the drawing surface of FIG. 3A. The ratio of an area occupied by the pixel array 10 to the area of the entire first substrate S1 is, for example, 5%. It is preferable for the pixel array 10 to occupy an area larger than 3% but smaller than 10%. This kind of an arrangement can satisfy the required optical format and allow high speed signal processing to be performed in the second substrate S2. The second substrate S2 includes the readout circuit RD that reads out the signals from the pixel array 10. The first substrate S1 and the second substrate S2 preferably have the same area. Alternatively, the difference between the areas of the two substrates is preferably within 10%.

Figure 4:
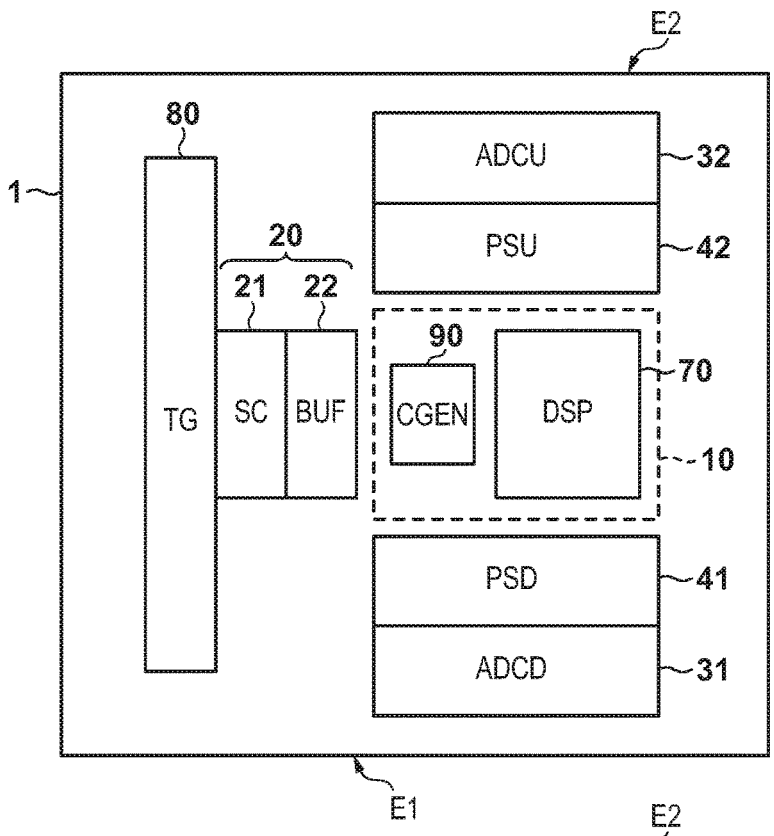
FIG. 4 is a view showing an example of the layout arrangement of the solid-state imaging device according to one embodiment of the present invention.

FIG. 4 schematically shows the solid-state imaging device 1 formed by stacking the first substrate S1 and the second substrate S2. Here, a dotted line indicates the pixel array 10 of the first substrate S1, and a solid line indicates each component of the readout circuit RD of the second substrate S2. In an orthogonal projection to the predetermined surface (or alternatively in FIG. 4), at least a part of the pixel array 10 and at least a part of the processing circuit 70 overlap each other. Also, at least a part of the pixel array 10 and at least a part of the clock generation circuit 90 overlap each other in the orthogonal projection to the predetermined surface.

Also, in the orthogonal projection to the predetermined surface (or alternatively in FIG. 4), the first AD conversion circuit 31 is arranged between the processing circuit 70 and a first edge E1 of the second substrate S2, and the first parallel-serial conversion circuit 41 is arranged between the processing circuit 70 and the first AD conversion circuit 31. The second AD conversion circuit 32 is arranged between the processing circuit 70 and a second edge E2 of the second substrate S2, and the second parallel-serial conversion circuit 42 is arranged between the processing circuit 70 and the second AD conversion circuit 32. Here, the second edge E2 is the edge on the opposite side of the first edge E1.

Figure 5:
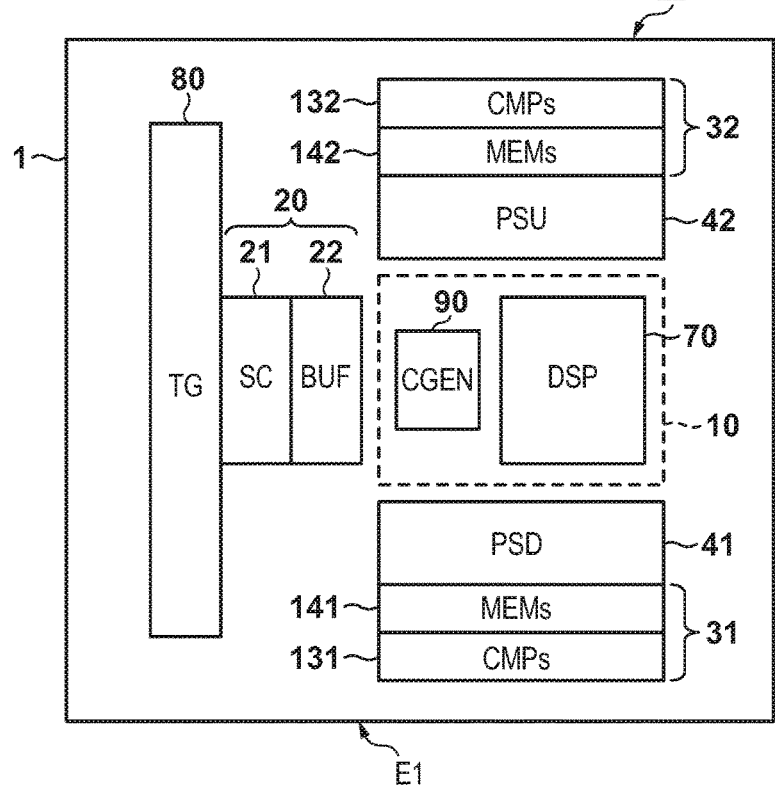
FIG. 5 is a view showing another example of the layout arrangement of the solid-state imaging device according to one embodiment of the present invention.

As shown in FIG. 5, in the orthogonal projection to the predetermined surface, a block formed by the plurality of first memories 141 can be arranged between a block formed by the plurality of first comparators 131 and the first parallel-serial conversion circuit 41. In the same manner, in the orthogonal projection to the predetermined surface, a block formed by the plurality of second memories 142 can be arranged between a block formed by the plurality of second comparators 132 and the second parallel-serial conversion circuit 42.

As exemplified in FIGS. 4 and 5, a signal from each pixel 11 belonging to the first group of the pixel array 10 arranged on the first substrate is transmitted to the side of the first edge E1 by the corresponding first signal line YDi. The signal is sequentially transmitted via the first AD conversion circuit 31 and the first parallel-serial conversion circuit 41, which are arranged from the first edge E1 of the second substrate S2 toward the processing circuit 70, and is provided to the processing circuit 70 which is arranged on the second substrate S2 so as to face the pixel array 10. Also, the signal of each pixel 11 belonging to the second group of the pixel array 10 arranged on the first substrate S1 is transmitted to the side of the second edge E2 by the corresponding signal line YUi. The signal is sequentially transmitted via the second AD conversion circuit 32 and the second parallel-serial conversion circuit 42, which are arranged from the second edge E2 of the second substrate S2 toward the processing circuit 70, and is provided to the processing circuit 70 which is arranged on the second substrate S2 so as to face the pixel array 10. According to such an arrangement, the manufacture of the solid-state imaging device 1 is facilitated by the simplification of the pixel structure, thereby suppressing characteristic variation among pixels. In addition, although not shown in FIGS. 4 and 5, the current sources CS can be arranged on the second substrate S2.

The first AD conversion circuit 31 can be arranged so as not to overlap the pixel array 10 in the orthogonal projection to the predetermined surface. In the same manner, the second AD conversion circuit 32 can be arranged so as not to overlap the pixel array 10 in the orthogonal projection to the predetermined surface. The first parallel-serial conversion circuit 41 can be arranged so as not to overlap the pixel array 10 in the orthogonal projection to the predetermined surface. In the same manner, the second parallel-serial conversion circuit 42 can be arranged so as not to overlap the pixel array 10 in the orthogonal projection to the predetermined surface.

Figure 6:
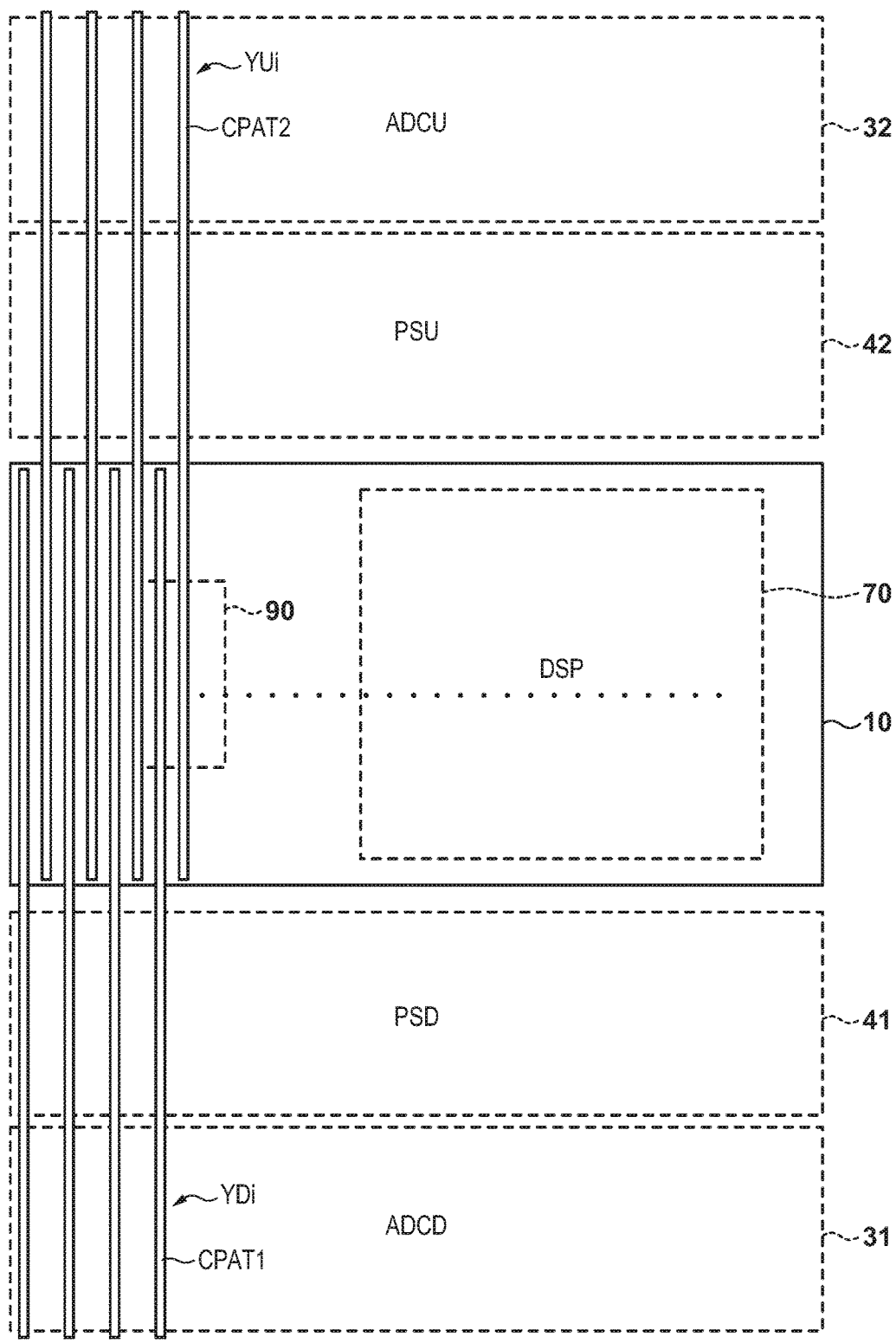
FIG. 6 is a view showing an example of the layout of first signal lines and second signal lines.

FIG. 6 shows an example of the layout of the first signal lines YDi and the second signal lines YUi. In FIG. 6, a solid line indicates each component of the first substrate S1 and a dotted line indicates each component of the second substrate S2. In the example shown in FIG. 6, each first signal line YDi has a first electrically conductive pattern CPAT1 arranged parallel to the predetermined surface (arranged parallel to the drawing surface), and each first electrically conductive pattern CPAT1 is arranged on the first substrate S1. In the same manner, each second signal lines YUi has a second electrically conductive pattern CPAT2 arranged parallel to the predetermined surface (arranged parallel to the drawing surface), and each second electrically conductive pattern CPAT2 is arranged on the first substrate S1. In the orthogonal projection to the predetermined surface, the first electrically conductive patterns CPAT1 overlap the first AD conversion circuit 31 and the first parallel-serial conversion circuit 41. Additionally, in the orthogonal projection to the predetermined surface, the second electrically conductive patterns CPAT2 overlap the second AD conversion circuit 32 and the second parallel-serial conversion circuit 42.

Figure 7:
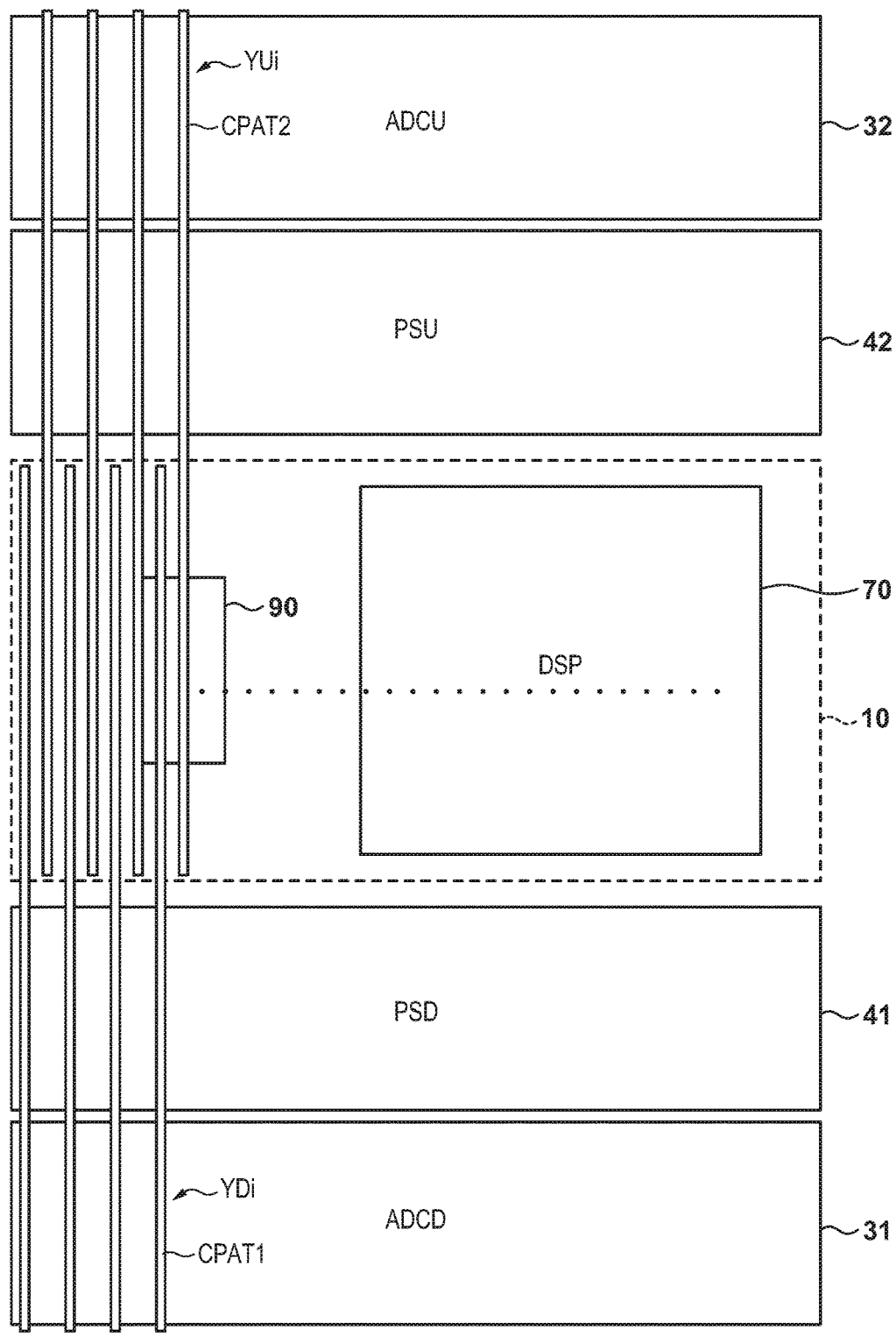
FIG. 7 is a view showing an example of another layout of the first signal lines and the second signal lines.

FIG. 7 shows another layout example of the first signal lines YDi and the second signal lines YUi. In FIG. 7, a dotted line indicates each component of first substrate S1 and a solid line indicates each component of the second substrate S2. In the example shown in FIG. 7, each first signal lines YDi has the first electrically conductive pattern CPAT1 arranged parallel to the predetermined surface (arranged parallel to the drawing surface), and each first electrically conductive pattern CPAT1 is arranged on the second substrate S2. In the same manner, each second signal line YUi has the second electrically conductive pattern CPAT2 arranged parallel to the predetermined surface (arranged parallel to the drawing surface), and each second electrically conductive pattern CPAT2 is arranged on the second substrate S2. In the orthogonal projection to the predetermined surface, the first electrically conductive patterns CPAT1 overlap the first AD conversion circuit 31 and the first parallel-serial conversion circuit 41. Additionally, in the orthogonal projection to the predetermined surface, the second electrically conductive patterns CPAT2 overlap the second AD conversion circuit 32 and the second parallel-serial conversion circuit 42.

Although the current sources CS are not shown in FIGS. 6 and 7, the current sources CS can be arranged on the second substrate S2, as described above. In the arrangements of FIGS. 6 and 7, the current source CS to be connected to the first signal lines YDi can be arranged between the first AD conversion circuit 31 and the edge (the first edge) on the side in which the first AD conversion circuit 31 is to be arranged on the second substrate S2. The current source CS to be connected to the second signal lines YUi can be arranged between the second AD conversion circuit 32 and the edge (the second edge) on the side of second AD conversion circuit 32 on the second substrate S2. Alternatively, both the first electrically conductive patterns CPAT1 and the second electrically conductive patterns CPAT2 can be arranged so as to extend from between the first edge and the first AD conversion circuit 31 to between the second edge and the second AD conversion circuit 32. In this case, the current source CS to be connected to the first signal lines YDi can be arranged between the second edge and the second AD conversion circuit 32, and the current source CS to be connected to the second signal lines YUi can be arranged between the first edge and the first AD conversion circuit 31.

Figure 8:
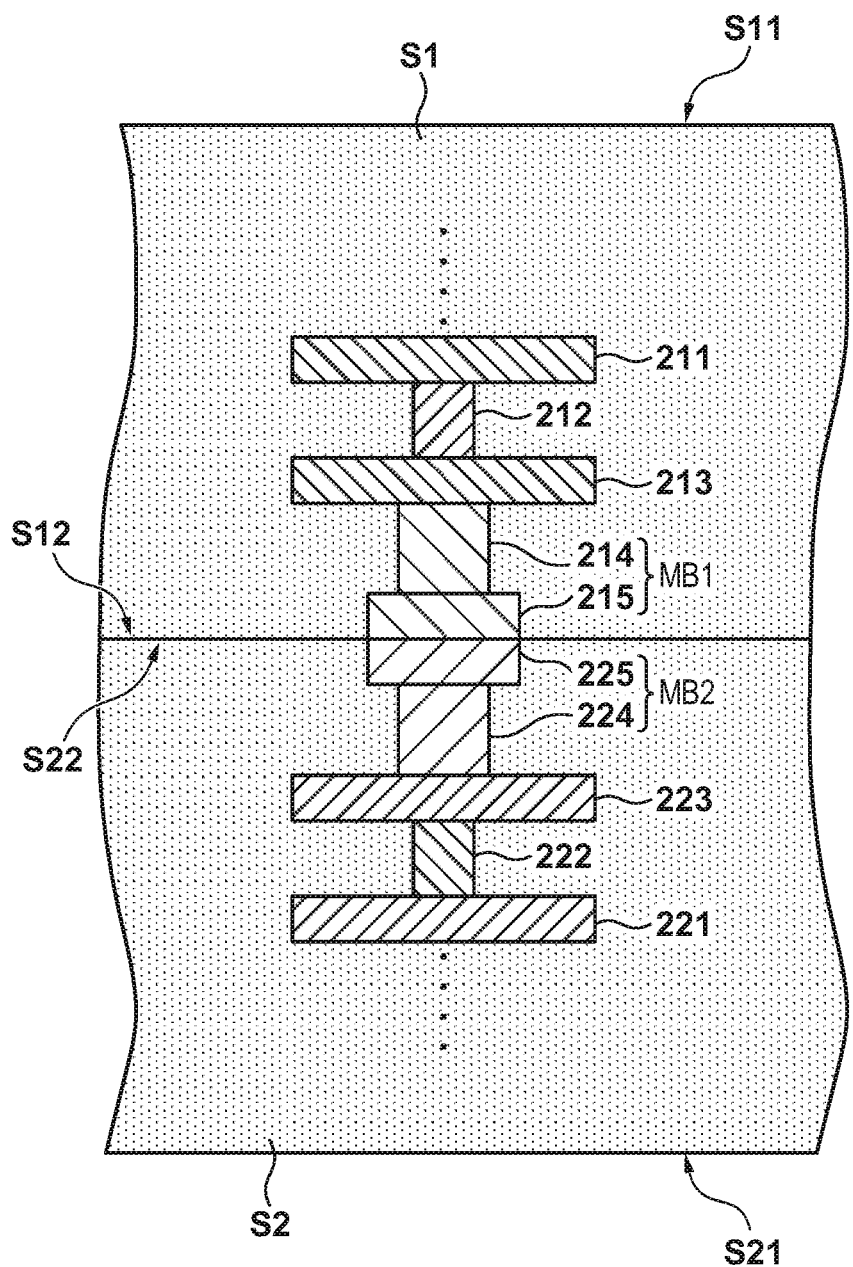
FIG. 8 is a view showing an example of the structure for electrical connection between the first substrate and the second substrate.

FIG. 8 shows a structure for electrically connecting the first substrate S1 and the second substrate S2. The first substrate S1 has a first surface S11 and a second surface S12 that oppose each other. The predetermined surface can either be the first surface S11 or the second surface S12. The first substrate S1 can include a plurality of wiring layers 211 and 213, a via plug 212 for the electrical connection between the wiring layers 211 and 213, and a microbump MB1. The microbump MB1 electrically connects the wiring layer 213 and the connection region of the second surface S12 of the first substrate S1. The microbump MB1 includes a pad 215 exposed on the second surface S12 of the first substrate S1 and a via plug 214 that connects the pad 215 and the wiring layer 213.

The second substrate S2 has a first surface S21 and a second surface S22 that oppose each other. The second substrate S2 can include a plurality of wiring layers 221 and 223, a via plug 222 for the electrical connection between the wiring layers 221 and 223, and a microbump MB2. The microbump MB2 electrically connects the wiring layer 223 and the connection region of the second surface S22 of the second substrate S2. The microbump MB2 includes a pad 225 exposed on the second surface S22 of the second substrate S2 and a via plug 224 that connects the pad 225 and the wiring layer 223.

The first substrate S1 and the second substrate S2 are bonded to each other so that the second surface S12 of the first substrate S1 and the second surface S22 of the second substrate S2 face each other. The pad 215 of the first substrate S1 and the pad 225 of the second substrate S2 are electrically connected.

Normally, the first surface S11 of the first substrate S1 is the surface that becomes the back surface (the surface chucked by a substrate chuck) at the time of the manufacture of the first substrate S1. The pixels 11 of the pixel array 10 to be formed on the first substrate S1 can be back-surface-irradiation type pixels. Normally, the first surface S21 of the second substrate S2 is the surface that becomes the back surface (the surface chucked by the substrate chuck) at the time of the manufacture of the second substrate S2.

If the first electrically conductive patterns CPAT1 and the second electrically conductive patterns CPAT2 are to be arranged on the first substrate S1 in the manner of the example shown in FIG. 6, the first electrically conductive patterns CPAT1 and the second electrically conductive patterns CPAT2 can be arranged on the wiring layer 213 and/or the wiring layer 211. The first electrically conductive patterns CPAT1 and the second electrically conductive patterns CPAT2 arranged on the first substrate S1 can be connected to the wiring layer on the side of the second substrate S2, via the microbumps MB1 and MB2, on or near the first AD conversion circuit 31 and the second AD conversion circuit 32.

If the first electrically conductive patterns CPAT1 and the second electrically conductive patterns CPAT2 are to be arranged on the second substrate S2 as in the example shown in FIG. 7, the first electrically conductive patterns CPAT1 and the second electrically conductive patterns CPAT2 can be arranged on the wiring layer 223 and/or the wiring layer 221. The first electrically conductive patterns CPAT1 and the second electrically conductive patterns CPAT2 arranged on the second substrate S2 can be connected to the wiring layer of the pixels 11 on the side of the first substrate S1 via the microbumps MB1 and MB2 in the pixel array 10.

Figure 9:
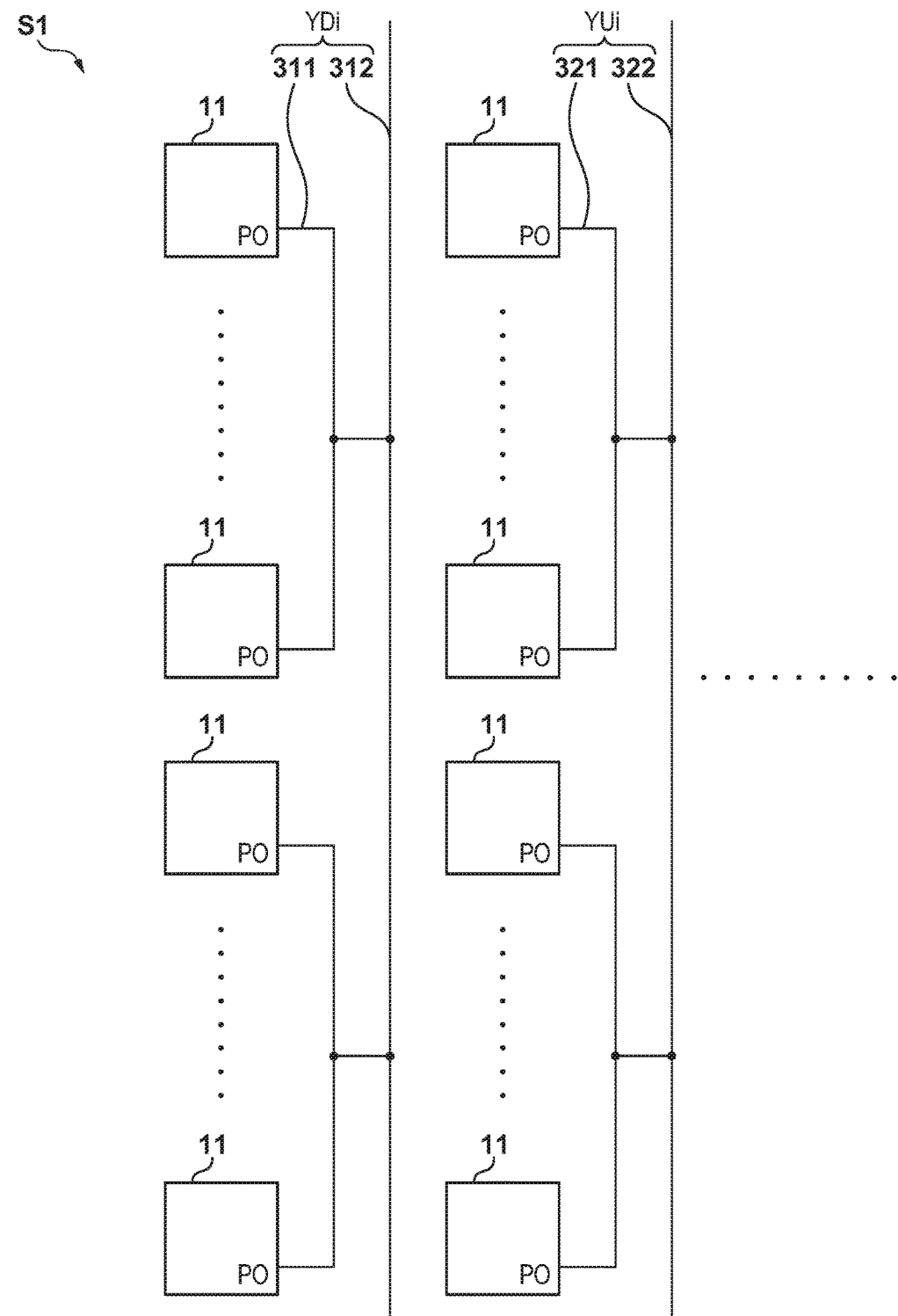
FIG. 9 is a view showing an example of the arrangement of the first signal line and the second signal line.

FIG. 9 shows an example of the arrangement of each first signal line YDi and each second signal line YUi. In the example of this arrangement, each first signal line YDi and each second signal line YUi are arranged on the first substrate S1. Each pixel 11 can include the photoelectric conversion element and the amplification transistor as described above.

The first substrate S1 includes, for the first group of pixels 11, a plurality of electrically conductive sub-lines 311 and electrically conductive main lines 312 to which the plurality of electrically conductive sub-lines 311 are connected. The plurality of electrically conductive sub-lines 311 and a corresponding one of the electrically conductive main lines 312 form each first signal line YDi. Each of the plurality of electrically conductive sub-lines 311 is arranged so that signals from (the amplification transistors of) at least two pixels 11 among (the amplification transistors of) the plurality of pixels 11 will be output.

The first substrate S1 also includes, for the second group of pixels 11, a plurality of electrically conductive sub-lines 321 and electrically conductive main lines 322 to which the plurality of electrically conductive sub-lines 321 are connected. The plurality of electrically conductive sub-lines 321 and a corresponding one of the electrically conductive main lines 322 form each second signal line YUi. Each of the plurality of electrically conductive sub-lines 321 is arranged so that signals from (the amplification transistors of) at least two pixels 11 among (the amplification transistors of) the plurality of pixels 11 will be output.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-131040, filed Jun. 30, 2016, which is hereby incorporated by reference herein in its entirety.

What is claimed is:

1. A photoelectric conversion device comprising a first substrate and a second substrate which are stacked, wherein
the first substrate includes a pixel array in which a plurality of pixels are arranged along a surface,
the second substrate includes a readout circuit configured to read out a signal from the pixel array,
the readout circuit includes a first AD conversion circuit configured to generate a plurality of first digital signals by performing analog-to-digital conversion on a plurality of first signals output from the pixel array to a plurality of first signal lines, a first parallel-serial conversion circuit configured to output a first serial signal by performing parallel-serial conversion on the plurality of first digital signals, and a processing circuit configured to process the first serial signal,
in an orthogonal projection to the surface, at least a part of the pixel array and at least a part of the processing circuit overlap with each other,
the first AD conversion circuit is arranged between a first edge of the second substrate and the processing circuit, and
the first parallel-serial conversion circuit is arranged between the first AD conversion circuit and the processing circuit.

2. The device according to claim 1, wherein the first AD conversion circuit includes a plurality of first column AD converters corresponding to the plurality of first signal lines, each of the first column AD converters includes a first comparator configured to compare a reference signal and a first signal output from the pixel array to a corresponding first signal line of the plurality of first signal lines, and each of the first column AD converters generates, as a first digital signal, a signal corresponding to a timing in which a comparison result by the first comparator is inverted.

3. The device according to claim 2, wherein each of the first column AD converters further includes a first memory configured to hold the first digital signal, and
the first memory is arranged between the first comparator and the first parallel-serial conversion circuit.

4. The device according to claim 1, wherein, in the orthogonal projection to the surface, the first AD conversion circuit does not overlap the pixel array.

5. The device according to claim 1, wherein in the orthogonal projection to the surface, the first parallel-serial conversion circuit does not overlap the pixel array.

6. The device according to claim 1, wherein each of the plurality of first signal lines includes a first electrically conductive pattern arranged parallel to the surface, and the first electrically conductive pattern is arranged on the first substrate.

7. The device according to claim 6, wherein in the orthogonal projection to the surface, the first electrically conductive pattern overlaps the first AD conversion circuit and the first parallel-serial conversion circuit.

8. The device according to claim 1, wherein each of the plurality of first signal lines includes a first electrically conductive pattern arranged parallel to the surface, and the first electrically conductive pattern is arranged on the second substrate.

9. The device according to claim 1, wherein the plurality of the first signal lines output, as the plurality of first signals, a plurality of pixel signals belonging to a first group of the plurality of pixels,
the readout circuit further includes a second AD conversion circuit configured to generate a plurality of second digital signals by performing analog-to-digital conversion on a plurality of second signals output from a plurality of pixel signals belonging to a second group of the plurality of pixels to a plurality of second signal lines and a second parallel-serial conversion circuit configured to output a second serial signal by performing parallel-serial conversion on the plurality of the second digital signals,
the second AD conversion circuit is arranged between a second edge of the second substrate and the processing circuit, and the second parallel-serial conversion circuit is arranged between the second AD conversion circuit and the processing circuit, and
the second edge is the edge on the opposite side of the first edge.

10. The device according to claim 9, wherein the second AD conversion circuit includes a plurality of second column AD converters corresponding to the plurality of second signal lines, each of the second column AD converters includes a second comparator configured to compare a reference signal and a second signal output from the pixel array to a corresponding second signal line of the plurality of second signal lines, and each of the second column AD converters generates, as a second digital signal, a signal corresponding to a timing in which a comparison result by the second comparator is inverted.

11. The device according to claim 10, wherein each of the second column AD converters further includes a second memory configured to hold the second digital signal, and
the second memory is arranged between the second comparator and the second parallel-serial conversion circuit.

12. The device according to claim 9, wherein the plurality of second signal lines have a plurality of second electrically conductive patterns arranged parallel to the surface, and the plurality of the second electrically conductive patterns are arranged on the first substrate.

13. The device according to claim 9, wherein in the orthogonal projection to the surface, the second AD conversion circuit does not overlap the pixel array.

14. The device according to claim 9, wherein in the orthogonal projection to the surface, the second parallel-serial conversion circuit does not overlap the pixel array.

15. The device according to claim 9, wherein each of the plurality of second signal lines includes a second electrically conductive pattern arranged parallel to the surface, and the second electrically conductive pattern is arranged on the first substrate.

16. The device according to claim 15, wherein in the orthogonal projection to the surface, the second electrically conductive pattern overlaps the second AD conversion circuit and the second parallel-serial conversion circuit.

17. The device according to claim 9, wherein each of the plurality of second signal lines includes a second electrically conductive pattern arranged parallel to the surface, and the second electrically conductive pattern is arranged on the second substrate.

18. The device according to claim 1, wherein the readout circuit further includes a clock generation circuit configured to generate a clock signal, and
in the orthogonal projection to the surface, at least a part of the pixel array and at least a part of the clock generation circuit overlap each other.

19. The device according to claim 1, wherein the plurality of pixels include a plurality of photoelectric conversion elements and a plurality of amplification transistors configured to amplify signals of the plurality of photoelectric conversion elements,
the first substrate includes a plurality of electrically conductive sub-lines and electrically conductive main lines to which the plurality of electrically conductive sub-lines are connected, and the plurality of electrically conductive sub-lines and a corresponding one of the electrically conductive main lines form the first signal line, and
each of the plurality of electrically conductive sub-lines is arranged so that signals from at least two amplification transistors of the plurality of amplification transistors are output.

20. The device according to claim 1, wherein electrical connection between the first substrate and the second substrate is performed by a microbump.

* * * * *